United States Patent
Wu et al.

(10) Patent No.: US 8,563,851 B2
(45) Date of Patent: Oct. 22, 2013

(54) METHOD TO INCREASE FIELD EFFECT MOBILITY OF DONOR-ACCEPTOR SEMICONDUCTORS

(75) Inventors: Yiliang Wu, Oakville (CA); Anthony J. Wigglesworth, Oakville (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/424,221

(22) Filed: Mar. 19, 2012

(65) Prior Publication Data

US 2013/0240841 A1  Sep. 19, 2013

(51) Int. Cl.
*H01L 31/00* (2006.01)

(52) U.S. Cl.
USPC ...... 136/253; 526/256; 257/40; 257/E51.005; 257/E51.018

(58) Field of Classification Search
USPC ............ 136/263; 526/256; 257/40, E51.005, 257/E51.018
See application file for complete search history.

(56) References Cited

U.S. PATENT DOCUMENTS

| | | | |
|---|---|---|---|
| 6,107,117 A | 8/2000 | Bao et al. | |
| 6,451,459 B1 * | 9/2002 | Tieke et al. | 428/690 |
| 7,194,173 B2 | 3/2007 | Shtein et al. | |
| 7,425,723 B2 | 9/2008 | Ong et al. | |
| 7,910,684 B2 | 3/2011 | Li | |
| 7,919,573 B2 | 4/2011 | Li et al. | |
| 7,932,344 B2 | 4/2011 | Li | |
| 2007/0079867 A1 | 4/2007 | Chittibabu et al. | |
| 2007/0272296 A1 | 11/2007 | Brabec et al. | |
| 2009/0065878 A1 * | 3/2009 | Li | 257/411 |
| 2009/0278116 A1 * | 11/2009 | Yamate | 257/40 |
| 2010/0066950 A1 * | 3/2010 | Cho et al. | 349/106 |
| 2011/0215313 A1 | 9/2011 | Duggeli et al. | |
| 2011/0284082 A1 | 11/2011 | Kim et al. | |

FOREIGN PATENT DOCUMENTS

WO  WO 2004/112161 A2  12/2004

OTHER PUBLICATIONS

Online dictionary (Mercury lamp, 1979).*
U.S. Appl. No. 13/424,204, filed Mar. 19, 2012.
McCulloch et al.; "Liquid-crystalline semiconducting polymers with high charge-carrier mobility;" *Nature Materials*; Apr. 2006; pp. 328-333; vol. 5; Nature Publishing Group.
Huo et al.; "Bandgap and Molecular Level Control of the Low-Bandgap Polymers Based on 3,6-Dithiophen-2-yl-2,5-dihydropyrrolo[3,4-c]pyrrole-1,4-dione toward Highly Efficient Polymer Solar Cells;" *Macromolecules*; 2009; pp. 6564-6571; vol. 42; American Chemical Society.
Hadipour et al.; "Solution-Processed Organic Tandem Solar Cells;" *Advanced Functional Materials*; 2006; pp. 1897-1903; vol. 16; WILEY-VCH Verlag GmbH KGaA, Weinheim.
Gilot et al.; "Double and triple junction polymer solar cells processed from solution;" *Applied Physics Letters*; Apr. 2007; vol. 90; American Institute of Physics.
Wu et al.; "New Poly(arylene vinylene)s Based Diketopyrrolopyrrole for Ambipolar Transistors;" *Chemistry of Materials*; Sep. 30, 2011; pp. 4618-4624; vol. 23; American Chemical Society.
U.S. Office Action dated Mar. 7, 2013 from U.S. Appl. No. 13/424,204.
Office Action issued Jun. 5, 2013 in U.S. Appl. No. 13/728,148.

* cited by examiner

*Primary Examiner* — Shane Fang
(74) *Attorney, Agent, or Firm* — Oliff & Berridge, PLC

(57) ABSTRACT

A method including activating an electronic device, such as an organic thin film transistor, by exposing the device to non-ionizing radiation while the device is under an electrical field. Activation of the transistor increases the field effect mobility of the transistor.

20 Claims, 1 Drawing Sheet

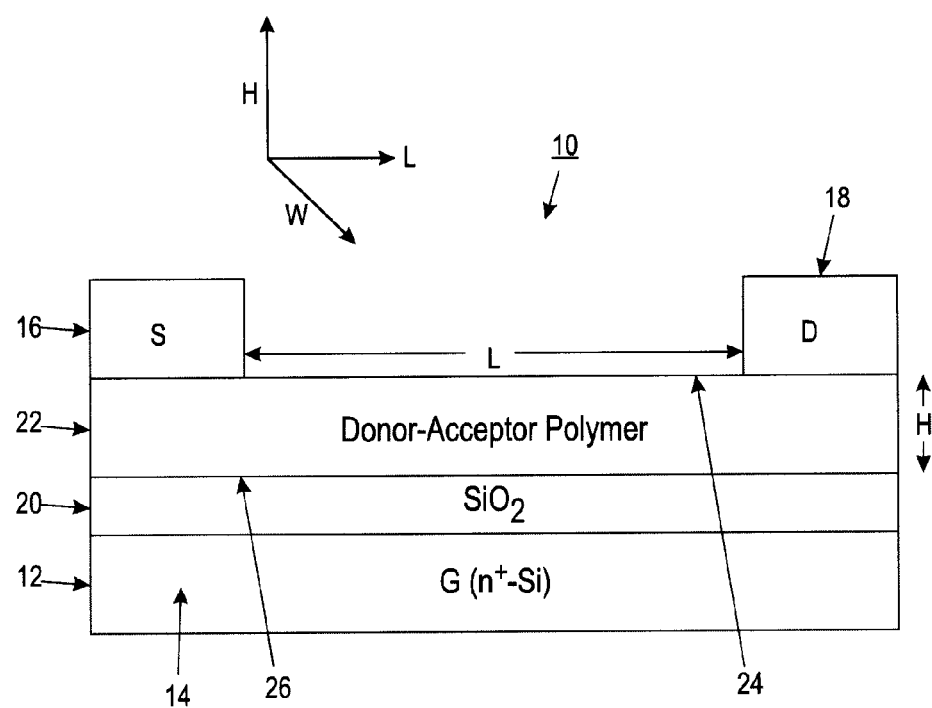

METHOD TO INCREASE FIELD EFFECT MOBILITY OF DONOR-ACCEPTOR SEMICONDUCTORS

BACKGROUND

Disclosed herein is a method to increase the field effect mobility of an electronic device by activating a donor-acceptor semiconductor in the device. The device may be, for example, an organic thin film transistor, or a photovoltaic device.

Thin film transistors (TFTs) are basic components of many electronic devices, including sensors, image scanners, and electronic display devices. Organic thin film transistors (OTFTs) offer advantages over conventional, silicon-based materials in that manufacturing costs can be reduced as well as providing mechanical properties such as the devices being physically compact, lightweight, and flexible. OTFTs are generally composed of a supporting substrate, three electrically conductive electrodes (gate, source and drain electrodes), a channel semiconductor layer, and an electrically insulating gate dielectric layer separating the gate electrode from the source and drain electrodes. The channel semiconductor is in turn in contact with the source and drain electrodes. The materials used to make the OTFTs, and the interfacial properties between various layers of semiconductor, dielectric, and electrodes can all affect the performance of the OTFTs.

As to the materials for development for printed OTFTs, the most challenging task is to obtain high performance semiconductors with a field effect mobility similar to or even surpassing conventional amorphous silicon semiconductors. To reach this goal, one approach is to continuously research for new semiconductor materials through molecular design. However, the development of new materials is often difficult and time consuming.

Therefore, an alternative approach to boost the performance of existing OTFTs through any novel physical or chemical means would be more attractive, since it eliminates the long development cycle of new materials.

Many semiconductors, for example those based on thiophene and/or fused-thiophene small molecules and polymers have been used for thin film transistors, and exhibited mediate mobility. Recently donor-acceptor semiconductors, such as polymers based on thiophene and/or fused-thiophene as donor and some electron deficient groups as acceptor, have shown a high field-effect mobility that is close to conventional amorphous silicon. Therefore, there is a need for physical or chemical methods that will further improve the field-effect mobility of OTFTs to equal to or surpass amorphous silicon semiconductor, especially OTFTs comprising a donor-acceptor type semiconductor composition.

SUMMARY

The above and other objects are achieved herein, wherein described is a process comprising activating an electronic device comprising a donor-acceptor semiconductor by exposing the electronic device to non-ionizing radiation under an electrical field.

Also described is a process for forming a transistor, the process comprising forming a semiconducting layer by depositing a donor-acceptor polymer in a solution on the transistor; drying the solution; biasing a gate electrode of the transistor; applying a source-drain voltage to the transistor; activating the transistor by irradiating the semiconducting layer while applying the source-drain voltage.

An activated thin film transistor is also described, wherein the activated thin film transistor has an increase in an average field effect mobility of at least 50%, when compared to the same transistor in the unactivated state.

BRIEF DESCRIPTION OF THE DRAWING

FIG. 1 is a cross sectional view of an embodiment of an OTFT having a semiconductor layer in accordance with a top-contact transistor.

EMBODIMENTS

The processes herein relate to activation of an electronic device comprising a donor-acceptor type semiconductor. The electronic device may be a transistor (for example a thin film transistor (TFT) comprising the donor-acceptor type semiconductor, which may be used, for example, in whole or in part of a semiconducting layer of the transistor. Such transistor is also called organic thin film transistor (OTFT). The present disclosure provides processes for forming a transistor comprising a donor-accepter semiconducting polymer. The transistor prepared with the disclosed process exhibits a higher field effect mobility compared to a transistor made with current or conventional processes using the same donor-acceptor polymers.

In embodiments, the process includes, for example, forming a semiconducting layer by depositing a solution comprising at least one donor-acceptor polymer on a substrate comprising a gate electrode and a gate dielectric layer and drying the solution; depositing a source electrode and a drain electrode on top of a semiconducting layer; biasing the gate electrode; applying a source-drain voltage to the transistor; and activating the donor-acceptor semiconducting polymer by irradiating the semiconducting layer while applying the source-drain voltage. It should be noted that conventional processes for fabrication of a transistor does not comprise a step of both irradiating and applying an electric field on a transistor at the same time.

A donor-acceptor polymer refers, for example, to a polymer having a repeat unit comprising an electron accepting group (the acceptor) and an electron donating group (the donor). For example, the electron donating group may be:

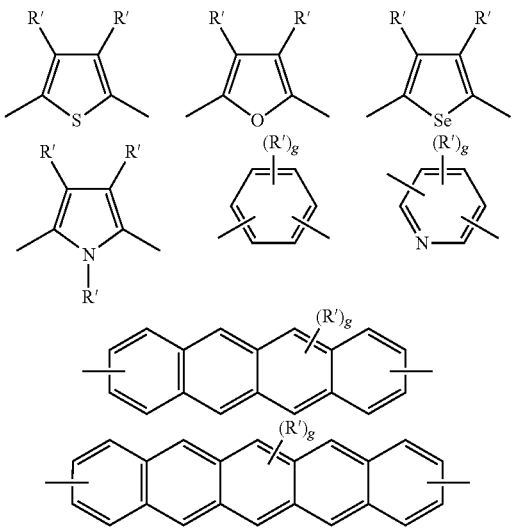

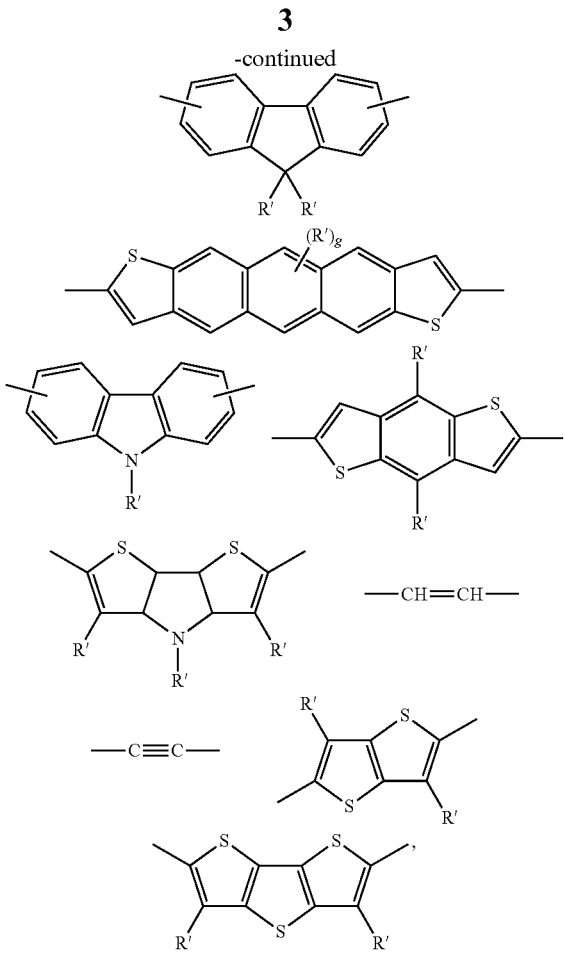

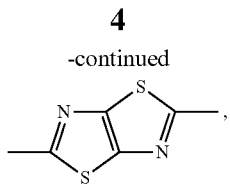

and the like,
wherein each R' is independently selected from hydrogen, alkyl, substituted alkyl, aryl, substituted aryl, heteroaryl, substituted heteroaryl, halogen, alkoxy, alkylthio, trialkylsilyl and g is from 1 to 12.

Example electron accepting groups include:

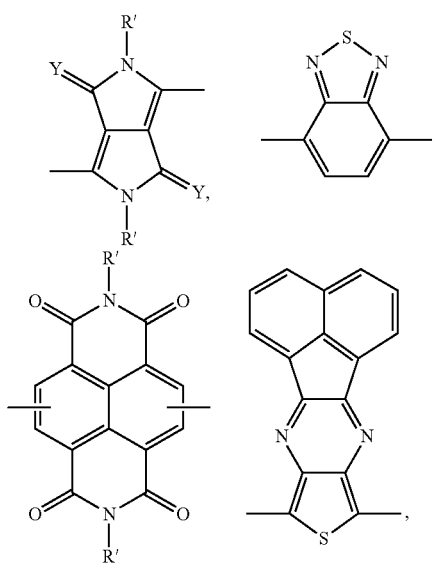

and the like, wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and Y is O or S.

The donor-acceptor semiconducting polymer may include, for example, those disclosed in U.S. Pat. Nos. 7,910,684 and 7,932,344, and U.S. patent application Ser. No. 13/312,315, filed on Dec. 6, 2011 and co-pending application Ser. No. 13/424,204, (entitled "Semiconductor Composition for High Performance Organic Devices") filed on the same date herewith in the name of Tony Wigglesworth and Yiliang Wu, the disclosures of each of which are hereby incorporated by reference in their entirety. For example, the donor-acceptor polymer may be a polymer of the formula (I):

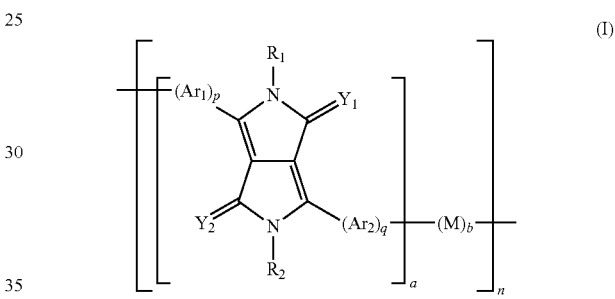

wherein $R_1$ and $R_2$ are independently hydrogen, alkyl, substituted alkyl, aryl, substituted aryl, heteroaryl, or substituted heteroaryl; $Y_1$ and $Y_2$ are independently S or O; a is an integer that is at least 1; the sum of (p+q) is an integer that is at least 1; $Ar_1$ and $Ar_2$ are independently an aromatic, heteroaromatic, alkenyl, or alkynyl group comprising 2-20 carbon atoms, and can be optionally substituted; M is a conjugated moiety; b is an integer from 0 to about 20; a is at least 1; and n is an integer from 2 to about 5,000. Substituted refers, for example, to the replacement of one or more of the hydrogens with an alkyl, aryl, alkylaryl, halogen, or hydroxyl group, hetero-containing group, such as heteroaryl, and combinations thereof, and the like.

$Ar_1$ and $Ar_2$ may, for example, be independently selected from the group consisting of:

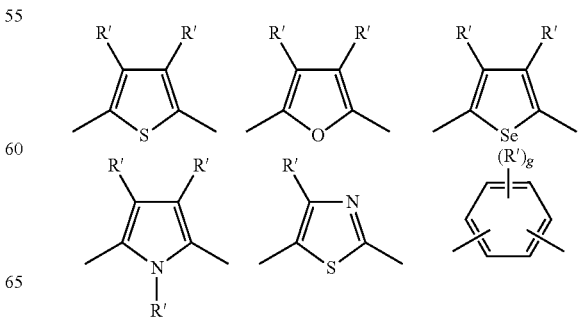

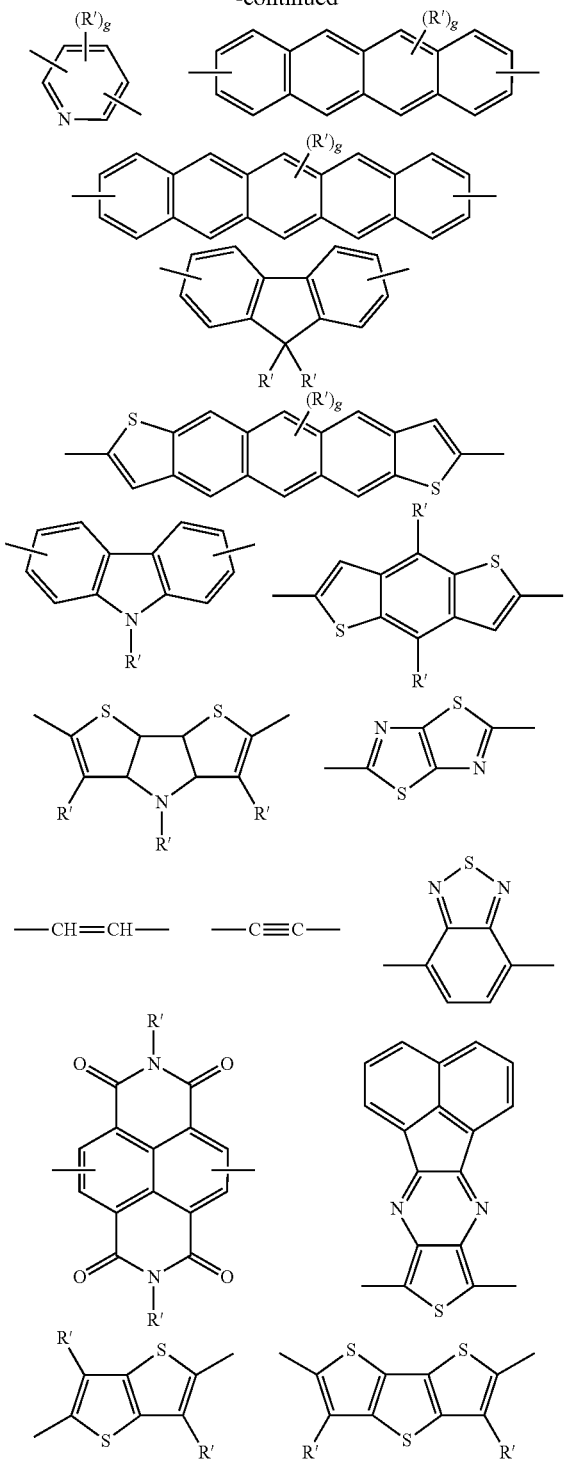

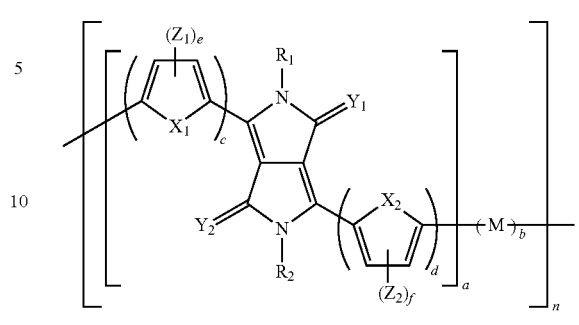

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 1 to 12.

For example, in embodiments of Formula (I), R$_1$ and R$_2$ may be alkyl, or Y$_1$ and Y$_2$ are O, or Y$_1$ and Y$_2$ are S. In other examples, b is 0, or the sum of (p+q) is at least 2.

More specifically, the donor-acceptor polymer may be a polymer of the formula (II):

wherein R$_1$ and R$_2$ are independently hydrogen, alkyl, substituted alkyl, aryl, substituted aryl, heteroaryl, or substituted heteroaryl; Y$_1$ and Y$_2$ are independently S or O; each X$_1$ and X$_2$ is independently S, Se, O, or NR'', wherein each R'' can independently be hydrogen or alkyl; each Z$_1$ and Z$_2$ is independently alkyl, substituted alkyl, aryl, substituted aryl, heteroaryl, substituted heteroaryl, halogen, alkoxy, alkylthio, trialkylsilyl, —CN, or —NO$_2$; M is a conjugated moiety; a is an integer that is at least 1; b is an integer from 0 to about 20; the sum of (c+d) is an integer that is at least 1; e and f are independently an integer from 0 to 2; and n is an integer from 2 to about 5,000, a polymer of the formula (III):

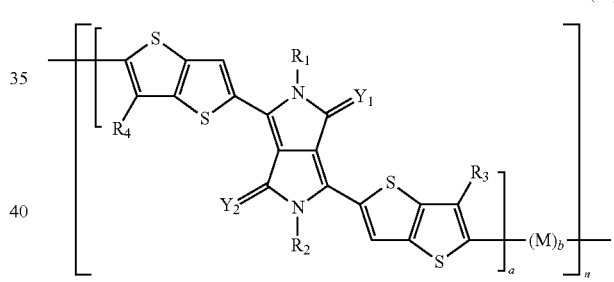

wherein R$_1$ and R$_2$ are independently hydrogen, alkyl, substituted alkyl, aryl, substituted aryl, heteroaryl, or substituted heteroaryl; Y$_1$ and Y$_2$ are independently S or O; R$_3$ and R$_4$ are independently hydrogen, alkyl, substituted alkyl, aryl, substituted aryl, heteroaryl, substituted heteroaryl, halogen, alkoxy, alkylthio, trialkylsilyl, —CN, or —NO$_2$; M is a conjugated moiety; a is at least 1; b is from 0 to about 20; and n is from 2 to about 5,000, a polymer of the formula (IV):

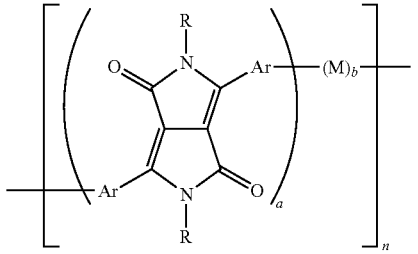

wherein each R is independently selected from hydrogen, an optionally substituted hydrocarbon, and a hetero-containing group; each Ar is independently selected from optionally substituted aryl and heteroaryl groups; each M is an optional, conjugated moiety; a represents an integer that is at least 1; b represents an integer from about 0 to about 20; and n represents an integer that is at least 1; and substituted refers, for example, to the replacement of one or more of the hydrogens with an alkyl, aryl, alkylaryl, halogen, or hydroxyl group, hetero-containing group, such as heteroaryl, and combinations thereof, and the like, a polymer of the formula (V):

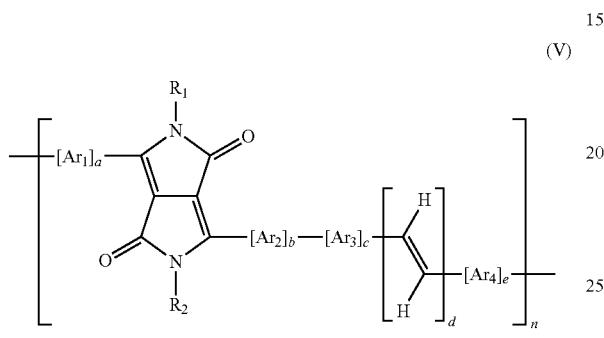

(V)

wherein, $R_1$ and $R_2$ are independently selected from hydrogen, a substituted or unsubstituted alkyl group, a substituted or unsubstituted aryl group, or a substituted or unsubstituted heteroaryl group; wherein $Ar_1$ and $Ar_2$ are independently an aromatic or heteroaromatic group comprising 4-30 carbon atoms, and can be optionally substituted, a and b are independently an integer from 1 to 4, $Ar_3$ and $Ar_4$ are independently an aromatic or heteroaromatic group comprising 4-20 carbon atoms, and can be optionally substituted, c and e are independently an integer from 0 to 2, d is 1 or 2 and the carbon-carbon double bond must be in the E-configuration, n represents an integer between about 1 and about 5,000, and substituted refers, for example, to the replacement of one or more of the hydrogens with an alkyl, aryl, alkylaryl, halogen, or hydroxyl group, hetero-containing group, such as heteroaryl, and combinations thereof, and the like.

M may, for example, be a conjugated moiety selected from the group consisting of:

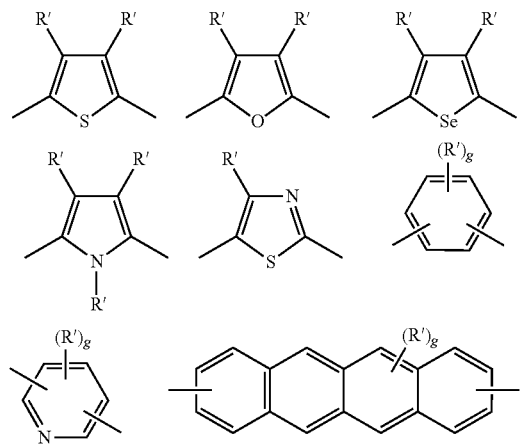

-continued

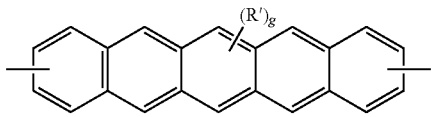

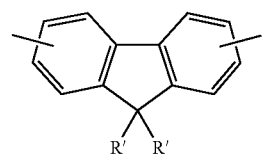

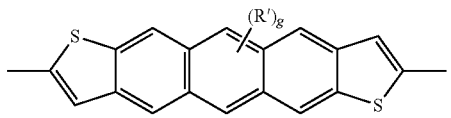

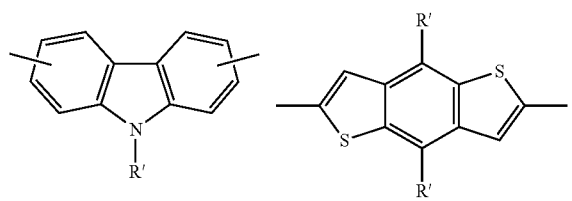

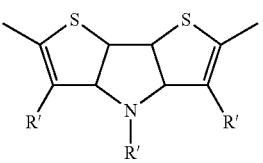 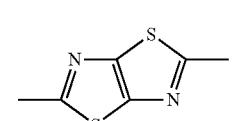

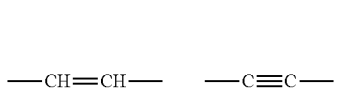 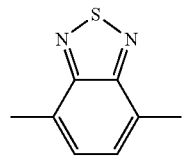

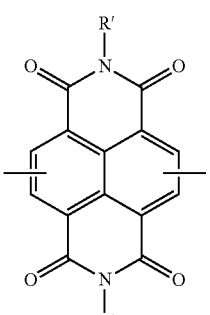 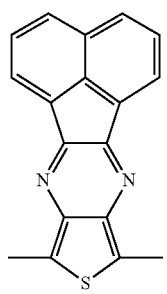

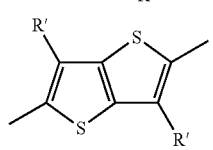 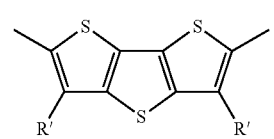

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 1 to 12.

Also disclosed in embodiments is a donor-acceptor polymer selected from the group consisting of Formula I to 22:

Formula (1)
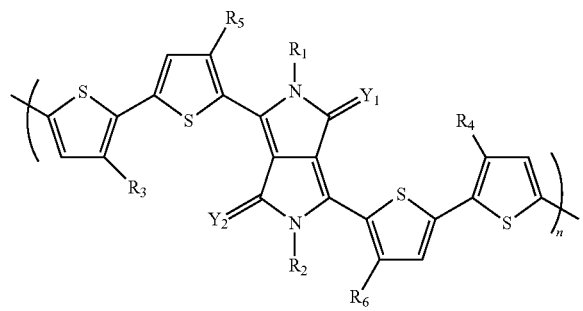
Formula (2)
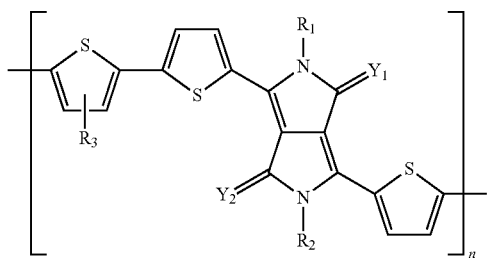
Formula (3)
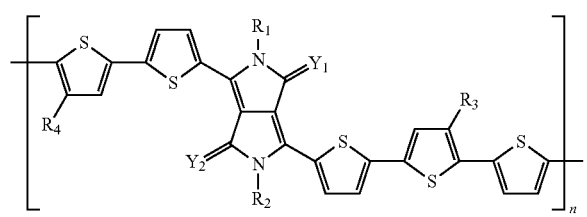
Formula (4)
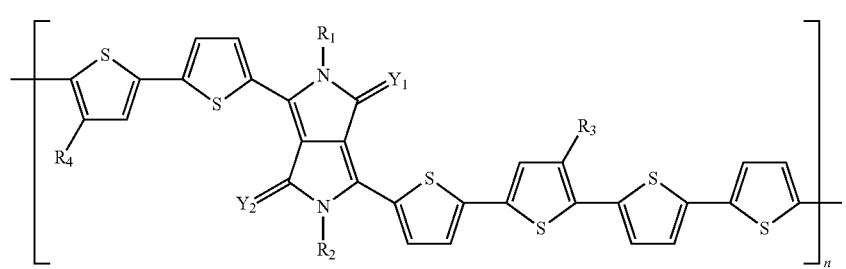
Formula (5)
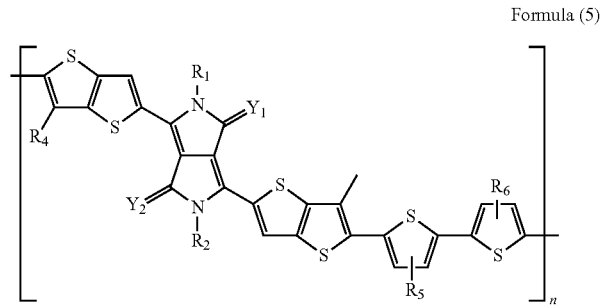
Formula (6)
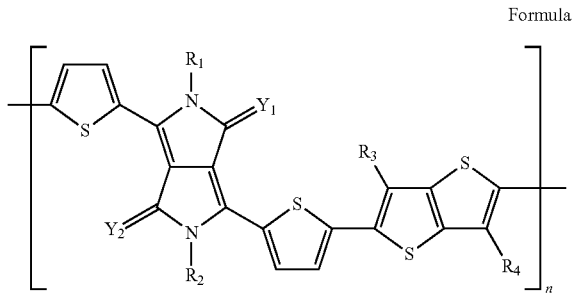
Formula (7)
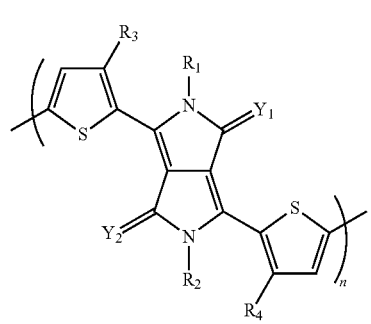
Formula (8)
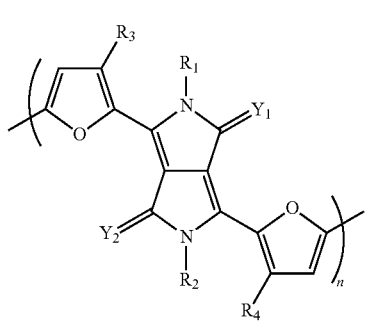

-continued
Formula (9)
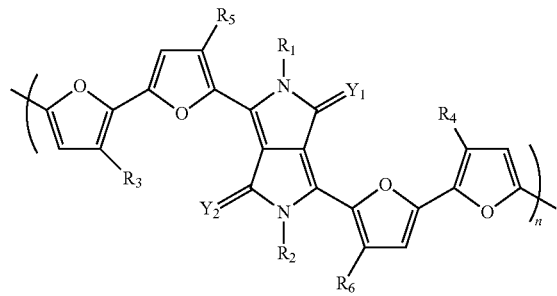
Formula (10)
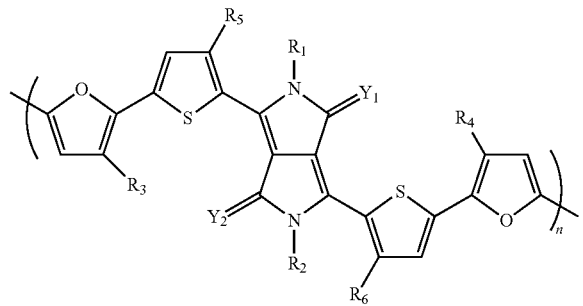
Formula (11)
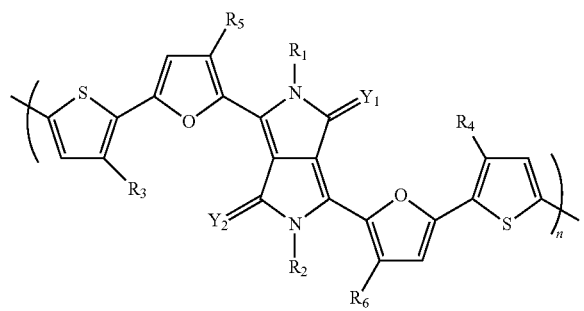
Formula (12)
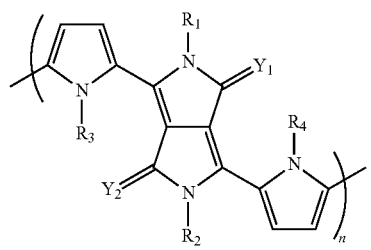
Formula (13)
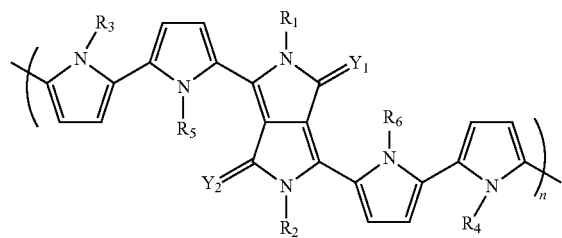
Formula (14)
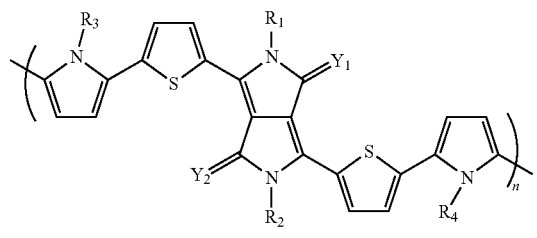
Formula (15)
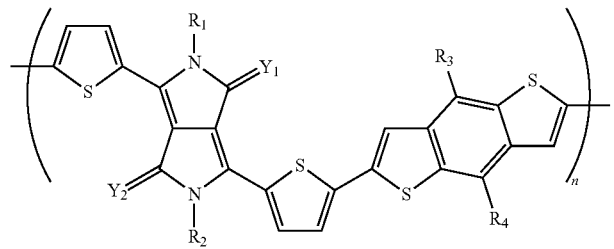

Formula (16)

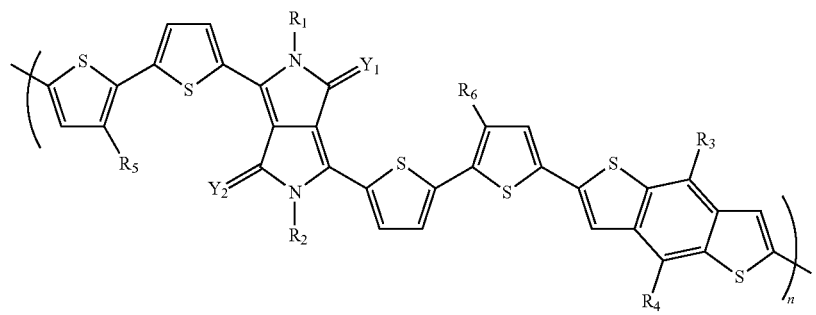

Formula (17)

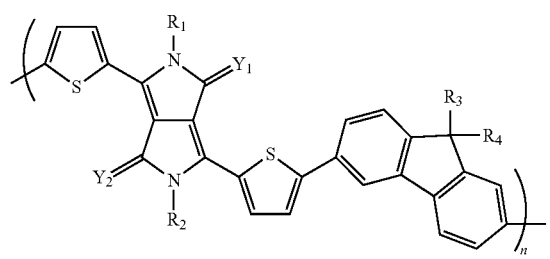

Formula (18)

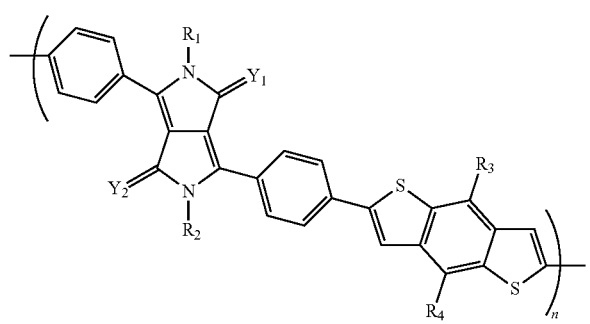

Formula (19)

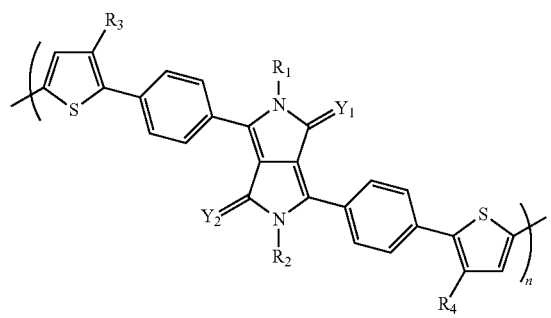

Formula (20)

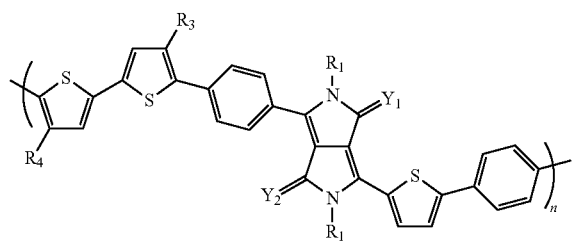

Formula (21)

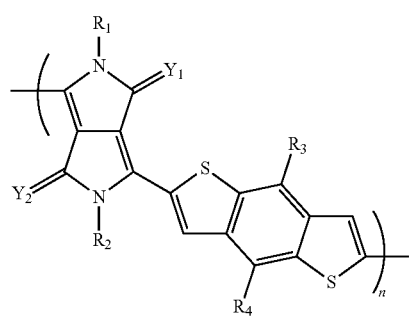

Formula (22)

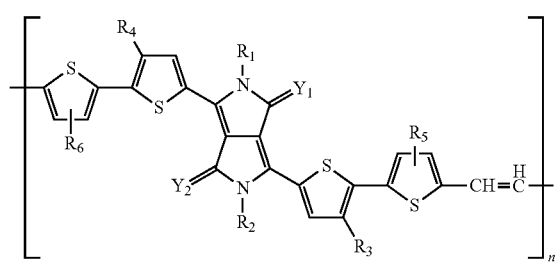

wherein $R_1$ and $R_2$ are independently hydrogen, alkyl, substituted alkyl, aryl, substituted aryl, heteroaryl, or substituted heteroaryl; $Y_1$ and $Y_2$ are independently S or O; and each $R_3$, $R_4$, $R_5$, and $R_6$ is independently hydrogen, alkyl, substituted alkyl, aryl, substituted aryl, heteroaryl, substituted heteroaryl, halogen, alkoxy, alkylthio, trialkylsilyl, —CN, or —NO$_2$; wherein n represents an integer from 2 to 5,000.

For example, the polymers described above may be:

Formula (1a)

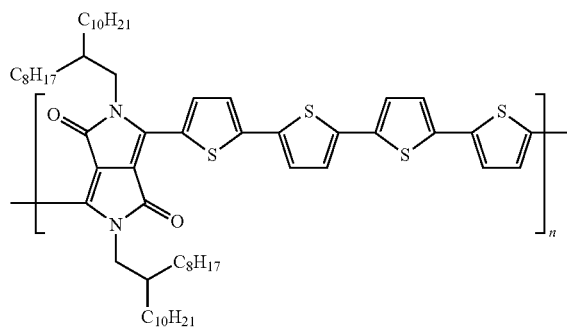

Formula (6a)

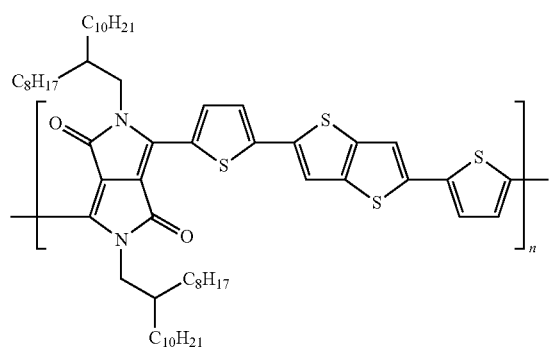

Formula (22a)

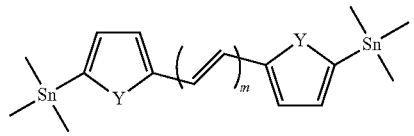

wherein n represents an integer from 2 to 5,000.

A process for forming the copolymers, includes, for example, by the Stille polycondensation method and end-capping with bromothiophene. For example, one method to form the copolymers includes mixing a first compound of the formula:

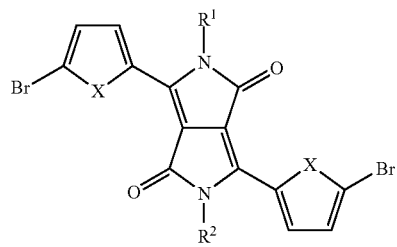

with a second compound of the formula:

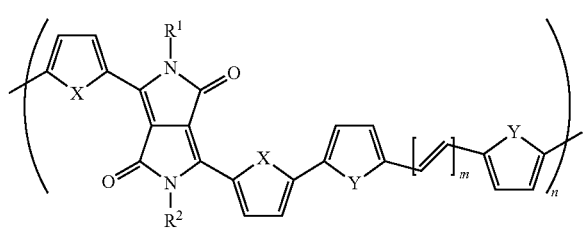

wherein, $R^1$ and $R^2$ are independently selected from a hydrogen, a substituted or unsubstituted alkyl group, a substituted or unsubstituted aryl group, or a substituted or unsubstituted heteroaryl group, X and Y are independently selected from O, S or Se, and m represents an integer from 0 to about 4, and in an environment that is substantially free of oxygen gas, adding a solvent that is substantially free of oxygen gas to dissolve the mixture; adding 2-bromothiophene to the mixture; and collecting an optionally purifying the mixture, to form a compound of the following formula:

wherein n is an integer between 1 and 5,000, or for example, by the following reaction scheme:

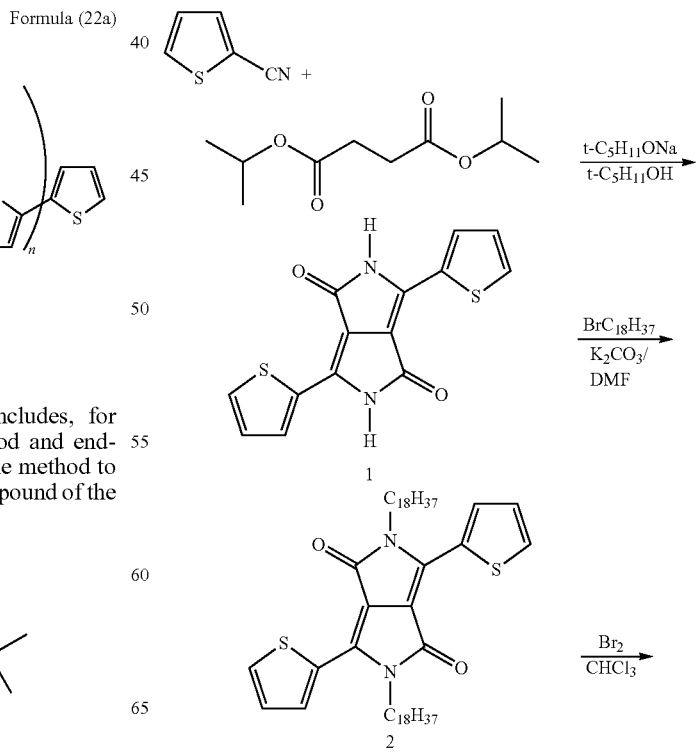

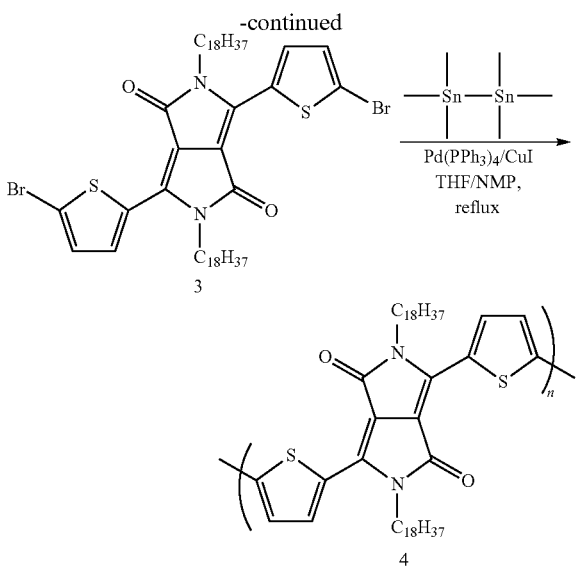

wherein n is an integer between 1 and 5,000.

The donor-acceptor polymer may be dissolved in any suitable solvent, for example, chlorobenzene, chlorotoluene, trichlorobenzene, dichlorobenzene, tetrachloroethane, trichloroethane, chloroform, and the like or mixtures, to form a solution. The polymer may comprise about 0.1 to about 5 wt % of the solution, such as from about 0.2 to about 2 wt % of the solution, or from about 0.2 to about 0.8 wt % of the solution. The solution may be optionally heated and agitated, for example, by shaking or stirring, in order to decrease the time necessary to dissolve the polymer in the solvent. The donor-acceptor polymer is dissolved in order to form a solution comprising the donor-acceptor polymer. The solution comprising the donor-acceptor polymer may be used to form a transistor or a semiconducting layer of a transistor, for example, by depositing the solution on a substrate.

In order to form a transistor or a semiconducting layer of a transistor, for example, a top contact transistor, the solution may be deposited onto a substrate by any suitable method in order to form a semiconducting layer. Solution deposition processes include, for example, spin coating, dip coating, flexographic printing, offset printing, and inkjet printing.

After the solution deposition of the semiconducting layer, the semiconducting layer is dried and may optionally be annealed. Drying may occur by any known process that does not alter the properties of the substrate, gate electrode, dielectric layer, and semiconducting layer, such as, for example, vacuum evaporation or in an oven. Annealing may occur at any temperature that does not alter the properties of the substrate, gate electrode, dielectric layer, and semiconducting layer, such as, for example, annealing in a vacuum oven at about 50° C. to about 300° C., such as from about 100° C. to about 250° C.

After formation of the semiconducting layer, and optionally following deposition of the source and drain electrodes, for example, by vacuum evaporation, an electrical field is applied to the transistor. The electrical field may be, for example, a direct current (DC) electrical field. The electrical field may be generated by, for example, biasing the gate electrode, for example, in the range of about −90V to about +30V, such as from about −80V to about +20V, or from about −70 V to about +10 V, and, while the gate is biased, applying a source-drain voltage to the transistor to create the electrical field. The source-drain voltage may be applied in the range of about −90 V to about +30 V, such as from about −80 V to about +20 V, from about −60 V to about 20 V, from about −10 to about +2 V, or from about −4 to about 0 V.

For example, both the gate and the source/drain voltages may be applied, or at least the source and drain voltage may be applied to generate the electrical field.

In order to form, for example, a bottom contact transistor, the source and drain electrodes may, for example, be deposited on the substrate, followed by deposition of the semiconducting layer. After deposition of the semiconducting layer, an electrical field may be generated as above.

When the transistor is under the effect of an electrical field, radiation is applied to activate the transistor. For example, the radiation may be applied to the semiconducting layer. Activation increases the field effect mobility of the transistor. For example, while the gate is biased and a source-drain voltage applied to the transistor, the transistor is irradiated to activate the donor-acceptor transistor. The radiation may be applied before or after any optional annealing of the semiconducting layer.

The radiation applied to the transistor may be non-ionizing radiation. For example, the radiation may have a wavelength in the range of about 200 nm to about 1,000 nm, such as from about 300 nm to about 900 nm, or from about 380 nm to about 750 nm. For example, the radiation may be white light or yellow light.

The radiation may be applied for any length of time needed to activate the donor-acceptor transistor. For example, the radiation could be applied as a short pulse of radiation, for example, from about 0.1 seconds to about 10 seconds, such as from about 0.5 seconds to about 5 seconds, or from about 1 second to about 2 seconds.

Exposing the transistor to radiation while it is under the effect of an electric field improves the field effect mobility of OTFTs, for example, in OTFTs comprising a donor-acceptor polymer, when compared to the field effect mobility of OTFTs which have not been exposed to radiation. For example, exposing the transistor to radiation may increase the field effect mobility by a factor of about 50% to about 300%, such as from about 50% to about 150%, or about 60% to about 100%. In other words, exposing the transistor to radiation may increase the field effect mobility by at least 50% when compared to the same transistor in the unactivated state.

Field effect mobility is measured by acquiring the transfer and output curves of the transistor in both linear and saturated region. The mobilities in the linear and saturated regimes were extracted from the following equations:

$$\text{Linear regime } (V_D<<V_G): I_D = V_D C_i \mu (V_G - V_T) W/L$$

$$\text{Saturated regime } (V_D>V_G): I_D = C_i \mu (W/2L)(V_G - V_T)^2$$

where $I_D$ is the drain current, $C_i$ is the capacitance per unit area of the gate dielectric layer, and $V_G$ and $V_T$ are respectively the gate voltage and threshold voltage. $V_T$ of the device was determined from the relationship between the square root of $I_D$ at the saturated regime and $V_G$ of the device by extrapolating the measured data to $I_D$=0.

Furthermore, the increase in the field effect mobility resulting from the activation is stable. Stability refers, for example, to no degradation of the field effect mobility, for example, after 1 week, where the transistors were stored in the dark.

Without being limited to any theory, it is believed that the process is able to increase the field effect mobility because i) a photo-activated electrochemistry occurs at the electrode region and ii) a photo-activated polaron in the semiconductor layer increases the charge carrier density. Upon irradiation and applying an electrical field, electrochemistry such as a redox reaction takes place at the surface of the electrode. This electrochemical process reduces a charge injection barrier. Meanwhile, photo-generated charge species can be separated under an electrical field, which fills some dip charge traps in the semiconductor layer. A donor-acceptor semiconducting polymer will enable the separation of the photo-generated charge species under an electric field, due to the existence of strong electron donating and strong electron accepting groups in the polymer, thus a long lifetime of the photogenerated charge species will result. In other words, for a non-donor-acceptor semiconductor, although irradiation can generate charge carriers, the positive and negative charge species may have a very short lifetime. In other words, they combine to re-form the natural state quickly. Both these "activation" effects help increase charge transfer in the device, thus enhancing the mobility.

In general, a TFT includes a substrate, a gate electrode, source/drain electrodes, and a channel layer, which is a passage for current flow between source and drain electrodes. The channel layer may include an inorganic semiconductor and/or an organic semiconductor. When the TFT includes organic material to form the channel, the TFT is referred to as an OTFT.

The OTFT may be classified as a bottom contact or a top contact. In a bottom contact OTFT, a gate electrode is formed at a lower portion of an organic semiconductor and source and drain electrodes contact the organic semiconductor at the bottom of the organic semiconductor. In contrast, in the top contact OTFT, source and drain electrodes contact the organic semiconductor at the top of the organic semiconductor.

An example of a top contact OTFT is illustrated is FIG. 1. The illustrated semiconductor layer 22 has opposed first and second planar surfaces 24. The semiconductor layer 22 may have a thickness H ranging for example from about 10 nanometers to about 1 micrometer, or from about 20 to about 200 nanometers. The semiconductor channel width W may be, for example, from about 1 micrometers to about 5 millimeters, such as from about 5 micrometers to about 1 millimeter. The semiconductor channel length L may be, for example, from about 1 micrometer to about 1 millimeter such as from about 5 micrometers to about 100 micrometers.

The substrate 12 comprises or is in contact with gate electrode 14. Although in FIG. 1 the gate electrode 14 is depicted as being wholly within the substrate 12 (the entire substrate serves as the gate electrode in this embodiment), this is not required. However, the dielectric layer 20 separates the gate electrode 14 from the source electrode 16, drain electrode 18, and the semiconductor layer 22. In other examples, the gate electrode 14 may be formed as a channel in substrate 12, for example, by doping a portion of the substrate, or may be formed as a surface layer on the substrate 12.

The gate electrode 14 can be, for example, a thin metal film, a conducting polymer film, a conducting film made from conducting ink or paste or the substrate itself, for example heavily doped silicon. Examples of gate electrode materials include, for example, aluminum, gold, silver, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing, or doping of the substrate. The gate electrode 14 depicted in FIG. 1 is formed from n-doped silicon. The thickness of the gate electrode layer ranges, for example, from about 10 to about 200 nanometers for metal films and from about 1 to about 10 micrometers for polymer conductors.

The dielectric layer 20 generally can be an inorganic material film or an organic polymer film. Examples of inorganic materials suitable as the gate dielectric layer include silicon oxide, silicon nitride, aluminum oxide, barium titanate, barium zirconium titanate and the like; examples of organic polymers for the gate dielectric layer include polyesters, polycarbonates, poly(vinyl phenol), polyimides, polystyrene, poly(methacrylate)s, poly(acrylate)s, epoxy resin and the like. In FIG. 1, a thermally grown silicon oxide ($SiO_2$) layer may be used as the dielectric layer 20.

The thickness of the dielectric layer 20 is, for example from about 10 nanometers to about 2000, nanometers such as from about 100 nanometers to about 500 nanometers depending on the dielectric constant of the dielectric material used. The dielectric layer may have a conductivity that is for example less than about $10^{-12}$ S/cm. Conductivity was measured using the 4-probe method.

After deposition of the semiconducting layer 22 composed of the donor-acceptor, the semiconducting layer is dried and may optionally be annealed, as described above.

After deposition of the semiconducting layer 22, and optional annealing, a source electrode 16 and a drain electrode 18 may be deposited on top of the semiconducting layer 22 to form a top-contact transistor, as illustrated in FIG. 1 The semiconductor layer 22 may have opposed first and second planar surfaces 24, 26. The source electrode 16 contacts the semiconductor layer 22. The drain electrode 18 also contacts the same surface 24 of the semiconductor layer 22. The semiconductor layer 22 may run over the dielectric layer 20 and extends between the source and drain electrodes 16 and 18.

The source electrode 16 and drain electrode 18 may be made of any suitable electrically conductive materials. Materials suitable for use as source electrode 16 and drain electrode 18 include, for example, those of the gate electrode materials described previously, such as gold, nickel, aluminum, platinum, conducting polymers and conducting inks. In FIG. 1, the source electrode 16 and drain electrode 18 are formed from an electrically conductive material, such as gold.

Thicknesses of source and drain electrodes are for example, from about 40 nanometers to about 1 micrometer such as from about 100 to about 400 nanometers.

Other configurations of an OTFT are disclosed, for example, in U.S. Pat. Nos. 7,919,573 and 7,425,723, the disclosures of which are incorporated herein in their entireties, by reference.

In addition, in various embodiments, the gate dielectric layer, the gate electrode, the semiconductor layer, the source electrode, and the drain electrode are formed in any sequence with the gate electrode and the semiconductor layer both contacting the dielectric layer, and the source electrode and the drain electrode both contacting the semiconductor layer. The phrase "in any sequence" includes sequential and simultaneous formation. For example, the source electrode and the drain electrode can be formed simultaneously or sequentially. The composition, fabrication, and operation of field effect transistors are described, for example, in U.S. Pat. No. 6,107,117 the disclosure of which is totally incorporated herein by reference.

EXAMPLES

1. Example Donor-Acceptor Polymer of Formula 1a

A donor-acceptor polymer of diketopyrrolopyrrole and quarterthiophenes copolymer (Formula 1a), DKPP-QT, represented by the formula:

Formula (1a)

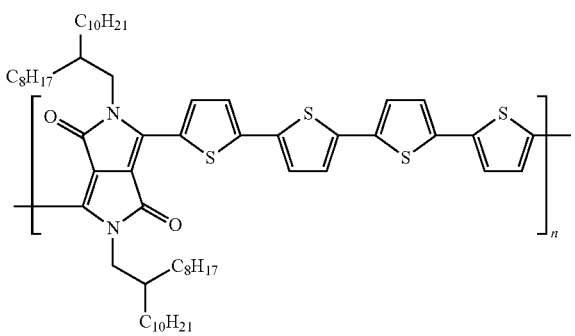

was synthesized using the following procedure, wherein "n" represents an integer between 1 and 5,000.

In a 2-necked 100 mL round-bottomed flask, 3,6-bis(5-bromothiophen-2-yl)-2,5-bis(2-octyldodecyl)pyrrolo[3,4-c]pyrrole-1,4(2H,5H)-dione (about 1.051 g, about 1.031 mmol) and 5,5'-bis(trimethylstannyl)-2,2'-bithiophene (about 0.507 g, about 1.031 mmol) were combined. The flask was fitted with a condenser and flushed with Ar for about 15 minutes. In a separate flask, anhydrous toluene was degassed by bubbling Ar through the solvent for at least about 30 minutes. The reactants were dissolved in about 25 mL of anhydrous, deoxygenated toluene and the reaction was treated with Pd(PPh$_3$)$_4$ (about 0.060 g, about 0.052 mmol). The reaction was then heated to an external temperature of about 95° C. and stirred under an Ar atmosphere. After about 24 hours, the reaction was treated with 2-bromothiophene (about 0.100 ml, about 1.031 mmol) to end-cap the polymer chains. After about 2 hours, the heating source was removed and the warm reaction mixture was poured into a mixture of deionized water (about 50 mL) and methanol (about 450 mL) to precipitate the polymer. Any residual polymer remaining in the flask was dissolved in CHCl$_3$ and added into the methanol solution. The crude polymer was collected by vacuum filtration and dried under vacuum. The crude polymer was purified by Soxhlet extraction with methanol (about 125 mL, at about 90° C., for about 4 hours), acetone (about 125 mL, at about 85° C., for about 4 hours) and hexanes (about 125 mL, at about 90° C., for about 18 hours) to remove any impurities and low molecular weight oligomers. The purified polymer was extracted into CHCl$_3$ (about 125 mL, at about 90° C., for about 4 hours) and poured into about 500 mL of methanol. The precipitated polymer was collected by vacuum filtration and dried under vacuum. The DKPP-QT polymer 1 was isolated as a dark purple solid.

2. Example Donor-Acceptor Polymer of Formula 22a

A donor-acceptor polymer of Formula 22a, DKPP-VT, represented by the formula:

Formula (22a)

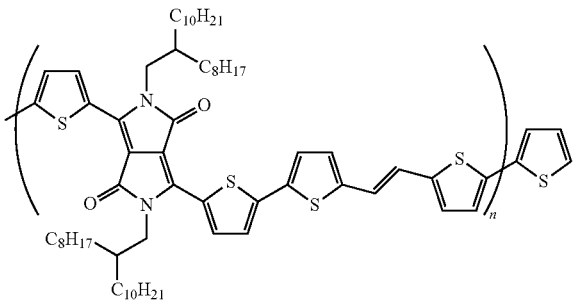

was synthesized using the similar procedure as in Example 1 for Polymer 1a, wherein "n" represents an integer between 2 and 5,000. The crude polymer was purified by Soxhlet extraction with methanol (about 125 mL, at about 90° C., for about 4 hours), acetone (about 125 mL, at about 85° C., for about 4 hours) and hexanes (about 125 mL, at about 90° C., for about 18 hours) to remove any impurities and low molecular weight oligomers. The purified polymer was extracted into CHCl$_3$ (about 125 mL, at about 90° C., for about 6 hours) and poured into about 500 mL of methanol. The precipitated polymer was collected by vacuum filtration and dried under vacuum. Polymer 22a was isolated as a dark purple solid and dried under high vacuum for about 18 hours.

3. Example Donor-Acceptor Polymer of Formula 6a

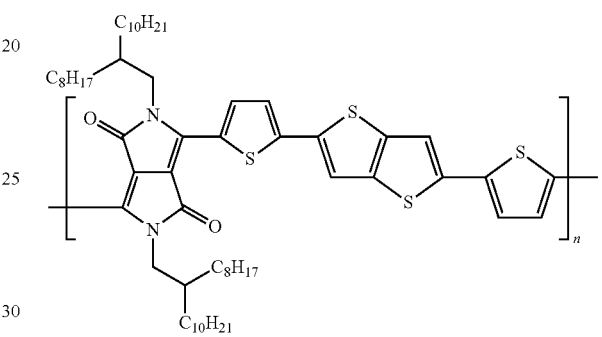

Formula (6a) was synthesized using the similar procedure as in Example 1 for Polymer 1a, wherein "n" represents an integer between 2 and 5,000. The crude polymer was purified by Soxhlet extraction with methanol (about 125 mL, at about 90° C., for about 4 hours), acetone (about 125 mL, at about 85° C., for about 4 hours) and hexanes (about 125 mL, at about 90° C., for about 18 hours) to remove any impurities and low molecular weight oligomers. The purified polymer was extracted into CHCl$_3$ (about 125 mL, at about 90° C., for about 6 hours) and poured into about 500 mL of methanol. The precipitated polymer was collected by vacuum filtration and dried under vacuum. Polymer 6a was isolated as a dark purple solid and dried under high vacuum for about 18 hours.

Example OTFT Fabrication 1,1,2,2-tetrachloroethane was used as the solvent. The donor-acceptor semiconducting polymer of Examples 1 to 3 was first dissolved in 1,1,2,2-tetrachloroethane solvent (about 0.6 wt % for polymer 1, about 0.3 wt % for polymer 2) with the assistance of heat and shaking to form stable dark blue solutions. After filtering with a 0.2 μm syringe filter, the solution was spin coated at about 1,000-2,000 rpm onto an octyltrichlorosilane (OTS-8) modified silicon wafer substrate, which comprises heavily doped silicon as gate electrode and about a 200 nm silicon oxide as gate dielectric layer. A smooth and shiny semiconductor film was obtained. After drying and optional annealing in a vacuum oven at about 150° C. for about 10 minutes, gold source and drain electrodes were vacuum evaporated on top of the semiconductor layer to form a series of top-contact transistors. For bottom contact transistors, gold source and drain electrodes were vacuum evaporated on top of the OTS-8 modified silicon oxide dielectric layer, followed by modifying the electrodes with butanethiol at about 23° C. to about 25° C. The semiconductor solution was subsequently spin coated to complete the bottom-contact transistor devices.

While the gate was biased and a source-drain voltage, at about −60 V, was applied to the transistor, a white light for polymers 1a and 6a (wavelength of about 380 nm to about 750 nm) or yellow light beam for polymer 22a (wavelength of 570 nm to about 590 nm) was focused on the transistor for about 1-2 seconds to activate the transistor.

Comparative examples were produced using the same materials and by the same methods described above, except that no activation step was performed.

Comparison of Activated OTFTs and Non-Activated OTFTs

After activation of the Example Polymers, the transistors were measured for the field effect mobility in the dark using Keithley SCS4200. The field effect mobility is measured by acquiring the transfer and output curves of the transistor in both linear and saturated region, as described above. In all OTFTs that underwent activation, the OTFT devices showed a high current on/off ratio over about $10^7$. The on/off ratio is the current at a gate voltage of −60 V over the current at a gate voltage of 0 V. The following table summarizes the field effect mobility of the transistors with and without the activation step in both top and bottom contact device configuration. The results demonstrate the field effect mobility increased in activated OTFTs when compared to the non-activated OTFTs, in some devices by a factor of 2.

TABLE 1

| Polymer | Without light Activation | | Light Activated OTFT | |
| --- | --- | --- | --- | --- |
| | $\mu_{max}/$ $cm^2V^{-1}s^{-1}$ | $\mu_{ave}/$ $cm^2V^{-1}s^{-1}$ | $\mu_{max}/$ $cm^2V^{-1}s^{-1}$ | $\mu_{ave}/$ $cm^2V^{-1}s^{-1}$ |
| Polymer 1a Top-contact | 0.87 | 0.65 | 1.02 | 0.87 |
| Polymer 1a Bottom-Contact | 0.52 | 0.46 | 0.99 | 0.75 |
| Polymer 22a Top-contact | 0.62 | 0.48 | 0.88 | 0.80 |
| Polymer 6a Top-contact | 0.60 | 0.42 | 1.10 | 0.91 |

The activated transistors were very stable. For example, when an activated transistor was annealed in vacuum oven at about 150° C. for about 10 minutes, the high mobility feature was retained. When the activated transistors were stored in air in the dark, no degradation of the mobility was observed over about one week. However, irradiation of the transistors without an electrical field could not improve the mobility.

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method comprising, activating an electronic device comprising a donor-acceptor semiconductor by exposing the electronic device to non-ionizing radiation while the electronic device is under an electrical field.

2. The method of claim 1, wherein the electronic device is a thin-film transistor, wherein the thin-film transistor comprises a semiconducting layer, wherein the semiconducting layer is exposed to non-ionizing radiation while under an electrical field.

3. The method of claim 1, wherein the electrical field is a DC electrical field.

4. The method of claim 2, wherein at least a part of the semiconducting layer comprises a polymer represented by the formula (I):

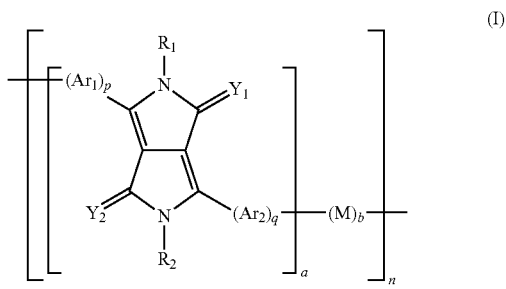

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O;

a is an integer that is at least 1;

the sum of (p+q) is an integer that is at least 1;

$Ar_1$ and $Ar_2$ are independently an aromatic, heteroaromatic, alkenyl, or alkynyl group comprising 2-20 carbon atoms, and can be optionally substituted;

M is a conjugated moiety;

b is an integer from 0 to about 20; and n is an integer from 2 to about 5,000.

5. The method of claim 4, wherein each $Ar_1$ and $Ar_2$ unit is independently selected from the group consisting of:

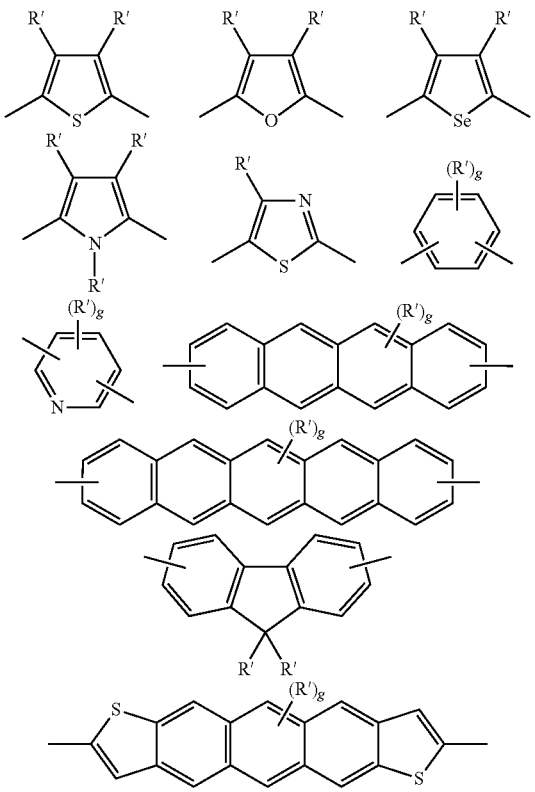

-continued

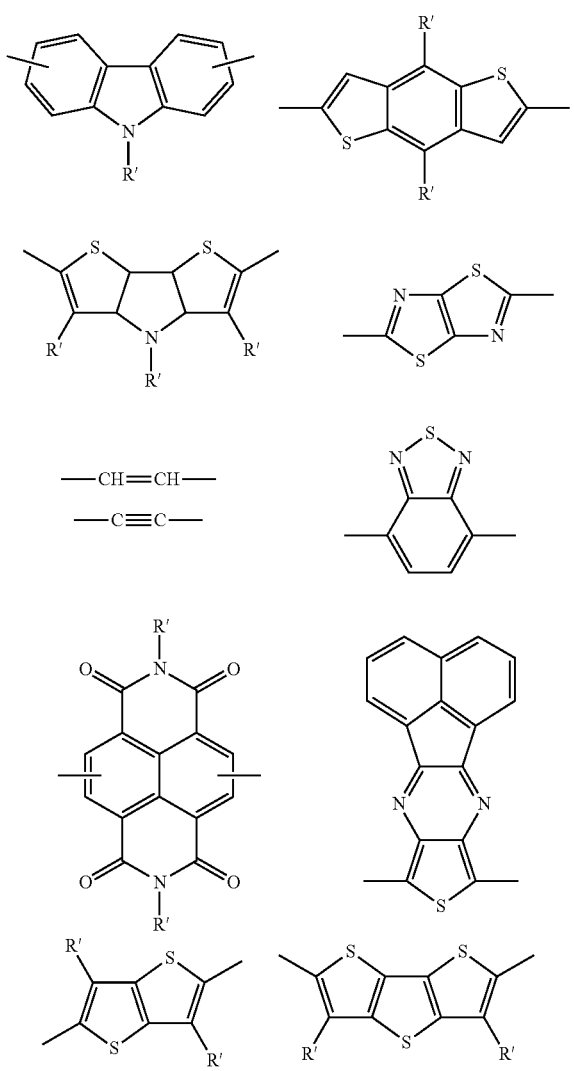

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 1 to 12.

6. The method of claim 4, wherein the polymer is represented by the formula (II) or (III):

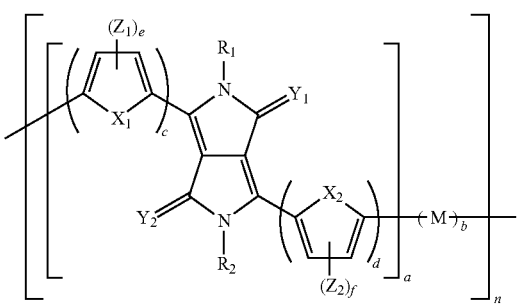
(II)

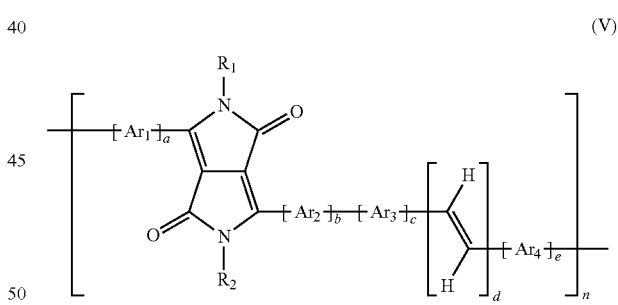
(III)

wherein R$_1$ and R$_2$ are independently hydrogen, alkyl, substituted alkyl, aryl, substituted aryl, heteroaryl, or substituted heteroaryl;

R$_3$ and R$_4$ are independently hydrogen, alkyl, substituted alkyl, aryl, substituted aryl, heteroaryl, substituted heteroaryl, halogen, alkoxy, alkylthio, trialkylsilyl, —CN, or —NO$_2$;

Y$_1$ and Y$_2$ are independently S or O;

each X$_1$ and X$_2$ is independently S, Se, O, or NR", wherein each R" can independently be hydrogen or alkyl;

each Z$_1$ and Z$_2$ is independently alkyl, substituted alkyl, aryl, substituted aryl, heteroaryl, substituted heteroaryl, halogen, alkoxy, alkylthio, trialkylsilyl, —CN, or —NO$_2$;

M is a conjugated moiety;

a is an integer that is at least 1;

b is an integer from 0 to about 20;

the sum of (c+d) is an integer that is at least 1;

e and f are independently an integer from 0 to 2; and n is an integer from 2 to about 5,000.

7. The method of claim 4, wherein the polymer is represented by formula (V):

(V)

wherein, R$_1$ and R$_2$ are independently selected from a hydrogen, a substituted or unsubstituted alkyl group, a substituted or unsubstituted aryl group, or a substituted or unsubstituted heteroaryl group;

wherein Ar$_1$ and Ar$_2$ are independently an aromatic or heteroaromatic group comprising 4-30 carbon atoms, and can be optionally substituted;

a and b are independently an integer from 1 to 4;

Ar$_3$ and Ar$_4$ are independently an aromatic or heteroaromatic group comprising 4-20 carbon atoms, and can be optionally substituted;

c and e are independently an integer from 0 to 2;

d is 1 or 2 and the carbon-carbon double bond must be in the E-configuration; and n is an integer from about 1 to about 5,000.

8. The method of claim 1, wherein the non-ionizing radiation has a wavelength in the range of about 200 nm to about 1,000 nm and wherein the exposure to non-ionizing radiation is from about 0.1 seconds to about 10 seconds.

9. The method of claim 2, wherein the transistor further comprises a gate electrode, wherein the electrical field is applied by biasing the gate electrode of the transistor and applying a source-drain voltage to the transistor, wherein the source-drain voltage is in the range of about −90 V to about +30 V.

10. The method of claim 2, wherein the activation increases the charge carrier mobility of the transistor by at least 50%.

11. A method for forming a transistor, the method comprising,
    forming a semiconducting layer by depositing a donor-acceptor polymer in a solution on the transistor;
    drying the solution;
    biasing a gate electrode of the transistor;
    applying a source-drain voltage to the transistor;
    activating the transistor by irradiating the semiconducting layer while applying the source-drain voltage.

12. The method of claim 11, wherein the irradiating comprises applying non-ionizing radiation in the range of about 200 nm to about 1,000 nm, the source-drain voltage is in the range of about −90 V to about +30 V, and wherein the activation increases the charge carrier mobility of the transistor by at least 50%.

13. The method of claim 11, wherein the forming of the semiconducting layer further comprises annealing the semiconducting layer after drying.

14. The method of claim 13, wherein the activating occurs after drying, but before annealing.

15. An activated thin film transistor, wherein the activated thin film transistor has an increase in an average field effect mobility of at least 50%, when compared to the same transistor in the unactivated state, and wherein the activated thin film transistor is formed by the method in claim 11.

16. The activated thin film transistor of claim 15, wherein at least a part of the activated transistor comprises a donor-acceptor semiconductor.

17. The activated thin film transistor of claim 16, wherein at least a part of the donor-acceptor semiconductor comprises at least one donor-acceptor polymer represented by the formula (I):

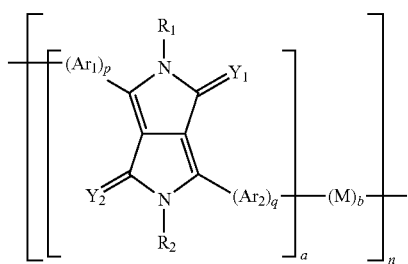

wherein $R_1$ and $R_2$ are independently hydrogen, alkyl, substituted alkyl, aryl, substituted aryl, heteroaryl, or substituted heteroaryl;
$Y_1$ and $Y_2$ are independently S or O;
a is an integer that is at least 1;
the sum of (p+q) is an integer that is at least 1;

$Ar_1$ and $Ar_2$ are independently an aromatic, heteroaromatic, alkenyl, or alkynyl group comprising 4-20 carbon atoms, and can be optionally substituted;
M is a conjugated moiety;
b is an integer from 0 to about 20; and
n is an integer from 2 to about 5,000.

18. The activated thin film transistor of claim 17, wherein at least one of the polymers is represented by the formula (II) or (III):

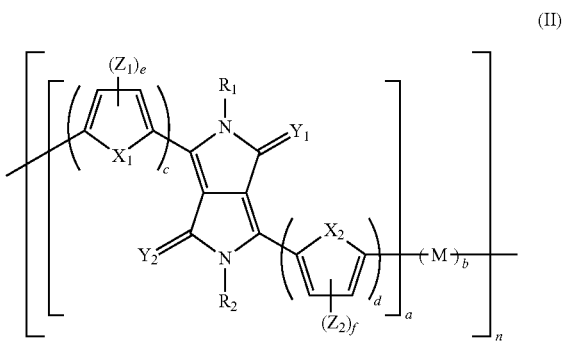

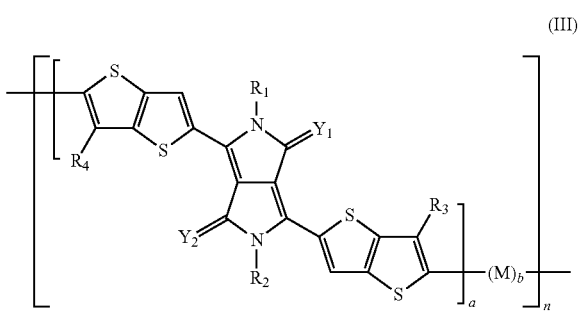

wherein $R_1$ and $R_2$ are independently hydrogen, alkyl, substituted alkyl, aryl, substituted aryl, heteroaryl, or substituted heteroaryl; $R_3$ and $R_4$ are independently hydrogen, alkyl, substituted alkyl, aryl, substituted aryl, heteroaryl, substituted heteroaryl, halogen, alkoxy, alkylthio, trialkylsilyl, —CN, or —NO$_2$;

$Y_1$ and $Y_2$ are independently S or O;

each $X_1$ and $X_2$ is independently S, Se, O, or NR", wherein each R" can independently be hydrogen or alkyl;

each $Z_1$ and $Z_2$ is independently alkyl, substituted alkyl, aryl, substituted aryl, heteroaryl, substituted heteroaryl, halogen, alkoxy, alkylthio, trialkylsilyl, —CN, or —NO$_2$;

M is a conjugated moiety;

a is an integer that is at least 1;

b is an integer from 0 to about 20;

the sum of (c+d) is an integer that is at least 1;

e and f are independently an integer from 0 to 2; and n is an integer from 2 to about 5,000.

19. The activated thin film transistor of claim 17, wherein at least one of the polymers is represented by the formula (V):

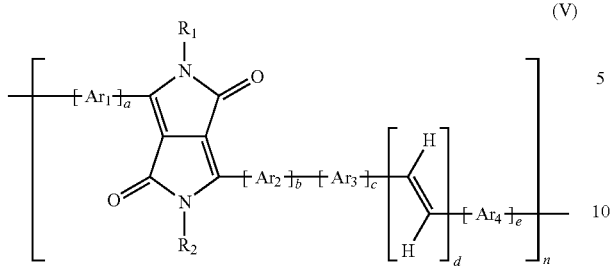
(V)

wherein, $R_1$ and $R_2$ are independently selected from a hydrogen, a substituted or unsubstituted alkyl group, a substituted or unsubstituted aryl group, or a substituted or unsubstituted heteroaryl group;

wherein $Ar_1$ and $Ar_2$ are independently an aromatic or heteroaromatic group comprising 4-30 carbon atoms, and can be optionally substituted;

a and b are independently an integer from 1 to 4;

$Ar_3$ and $Ar_4$ are independently an aromatic or heteroaromatic group comprising 4-20 carbon atoms, and can be optionally substituted;

c and e are independently an integer from 0 to 2;

d is 1 or 2 and the carbon-carbon double bond must be in the E-configuration; and n is an integer from about 1 to about 5,000.

20. The activated thin film transistor of claim 17, wherein the at least one donor-acceptor polymer is selected from the group consisting of:

Formula (1)

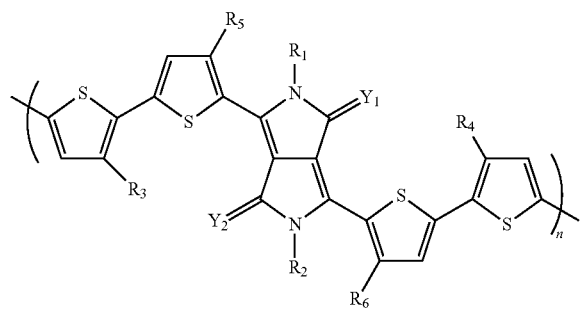

Formula (2)

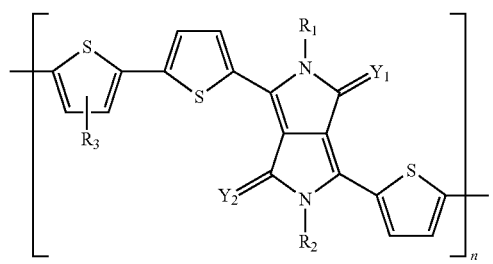

Formula (3)

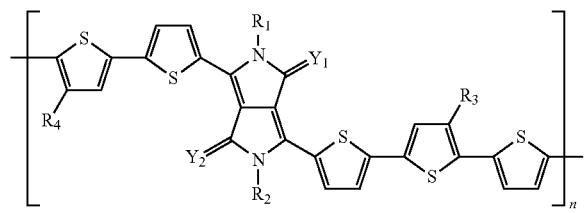

Formula (4)

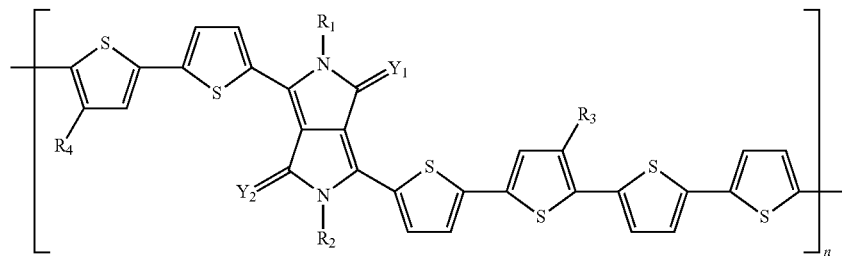

Formula (5)

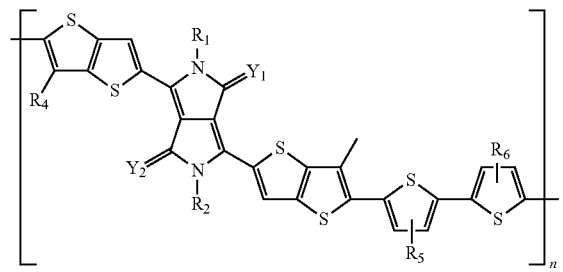

Formula (6)

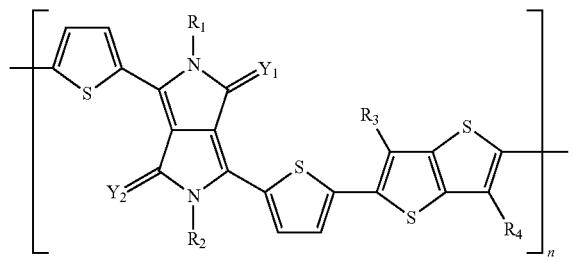

-continued
Formula (7)
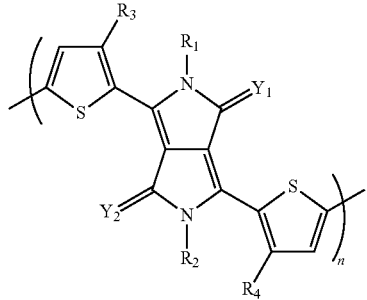
Formula (8)
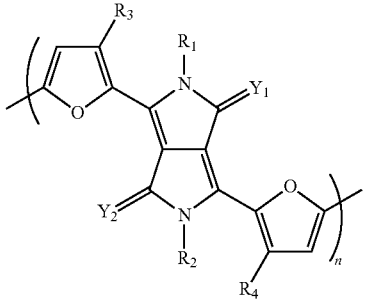
Formula (9)
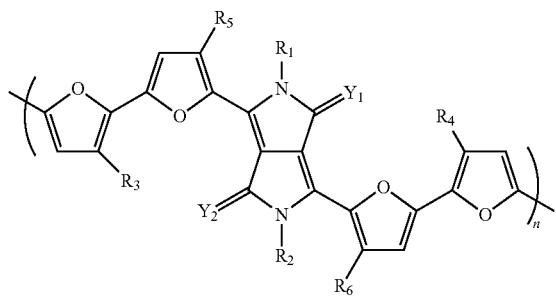
Formula (10)
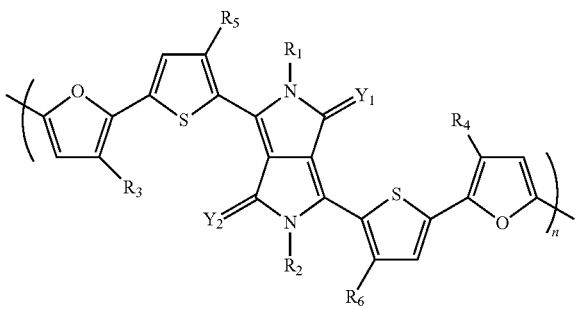
Formula (11)
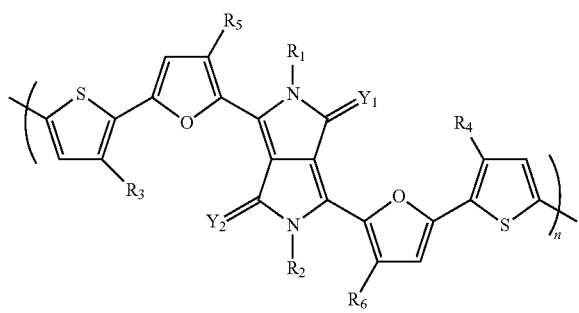
Formula (12)
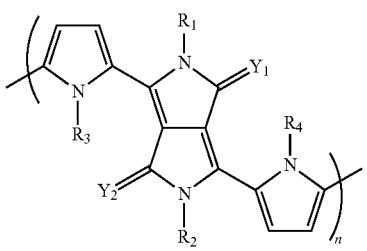
Formula (13)
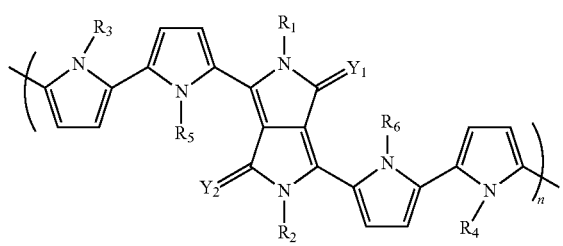
Formula (14)
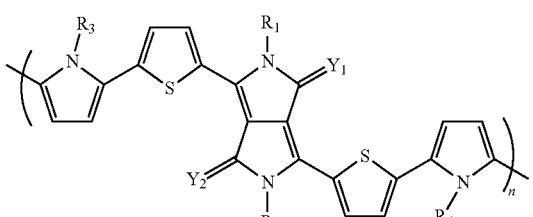
Formula (15)
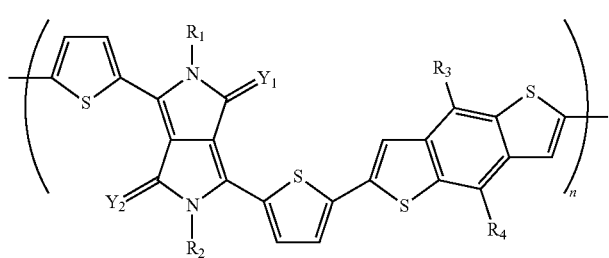

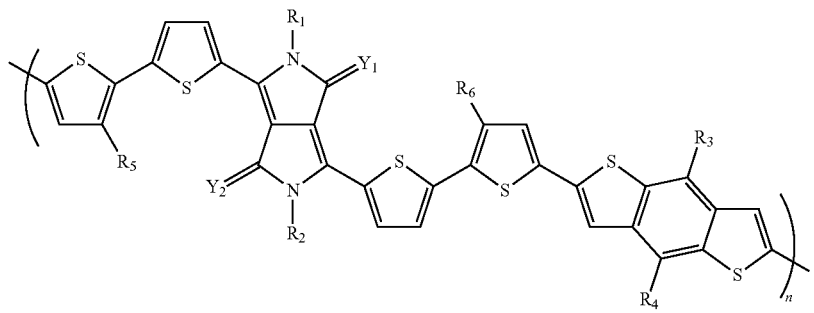
Formula (16)
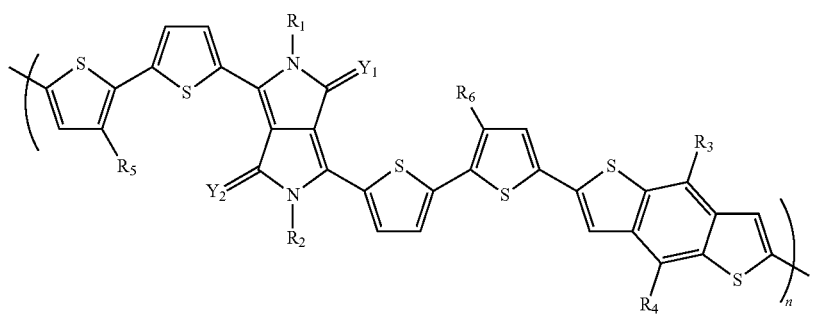
Formula (17)
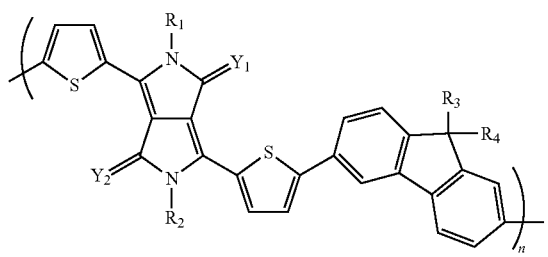
Formula (19)
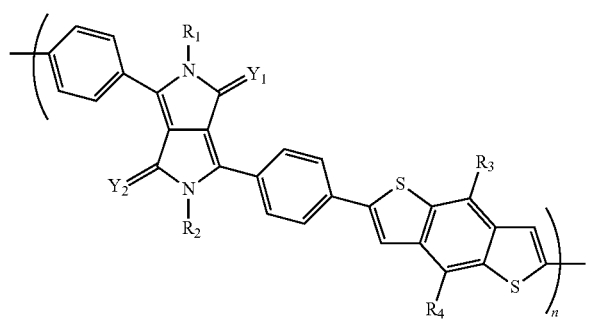
Formula (20)
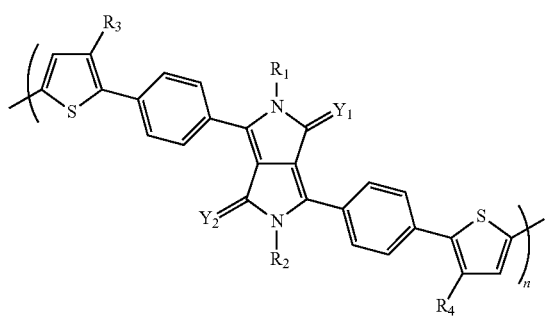
Formula (21)
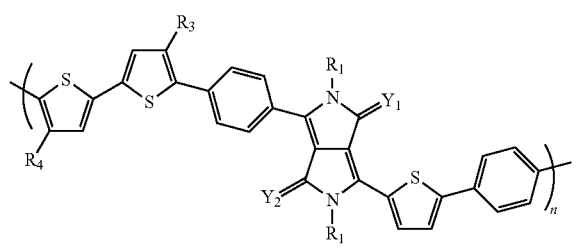
Formula (22)
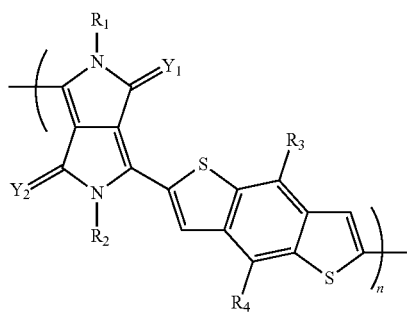

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O;

each $R_3$, $R_4$, $R_5$, and $R_6$ is independently hydrogen, alkyl, substituted alkyl, aryl, substituted aryl, heteroaryl, substituted heteroaryl, halogen, alkoxy, alkylthio, trialkylsilyl, —CN, or —$NO_2$; and n represents an integer from 2 to 5,000.

* * * * *